(12) United States Patent
Choi et al.

(10) Patent No.: US 9,053,977 B2
(45) Date of Patent: Jun. 9, 2015

(54) NONVOLATILE MEMORY DEVICE WITH VERTICAL SEMICONDUCTOR PATTERN BETWEEN VERTICAL SOURCE LINES

(75) Inventors: Eun-Seok Choi, Gyeonggi-do (KR); Hyun-Seung Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 265 days.

(21) Appl. No.: 13/610,781

(22) Filed: Sep. 11, 2012

(65) Prior Publication Data

US 2013/0113033 A1      May 9, 2013

(30) Foreign Application Priority Data

Nov. 9, 2011   (KR) .......................... 10-2011-0116213

(51) Int. Cl.
| | | |
|---|---|---|
| *H01L 29/792* | (2006.01) | |
| *H01L 27/115* | (2006.01) | |
| *H01L 29/66* | (2006.01) | |

(52) U.S. Cl.
CPC .... *H01L 27/11578* (2013.01); *H01L 27/11582* (2013.01); *H01L 29/7926* (2013.01); *H01L 29/66833* (2013.01)

(58) Field of Classification Search
CPC .................. H01L 27/11582; H01L 27/11578; H01L 29/7926; H01L 29/6683

USPC .......................................................... 257/324
See application file for complete search history.

(56) References Cited

U.S. PATENT DOCUMENTS

| | | | |
|---|---|---|---|
| 8,441,059 B2 * | 5/2013 | Sim et al. ...................... 257/324 |
| 2011/0018051 A1 * | 1/2011 | Kim et al. ..................... 257/324 |
| 2011/0090737 A1 * | 4/2011 | Yoo et al. ................. 365/185.11 |
| 2015/0009759 A1 * | 1/2015 | Lai ........................... 365/185.17 |

FOREIGN PATENT DOCUMENTS

| | | |
|---|---|---|
| KR | 1020110082328 | 7/2011 |
| KR | 101113765 | 2/2012 |

* cited by examiner

*Primary Examiner* — Mohammad Islam
*Assistant Examiner* — John P Dulka
(74) *Attorney, Agent, or Firm* — IP & T Group LLP

(57) ABSTRACT

A non-volatile memory device in accordance with one embodiment of the present invention includes a substrate including a P-type impurity-doped region, a channel structure comprising a plurality of interlayer insulating layers that are alternately stacked with a plurality of channel layers on the substrate, a P-type semiconductor pattern that contacts sidewalls of the plurality of channel layers, wherein a lower end of the P-type semiconductor pattern contacts the P-type impurity-doped region, and source lines that are disposed at both sides of the P-type semiconductor pattern and contact the sidewalls of the plurality of channel layers.

13 Claims, 21 Drawing Sheets

NONVOLATILE MEMORY DEVICE WITH VERTICAL SEMICONDUCTOR PATTERN BETWEEN VERTICAL SOURCE LINES

CROSS-REFERENCE TO RELATED APPLICATIONS

The present application claims priority of Korean Patent Application No. 10-2011-0116213, filed on Nov. 9, 2011, which is incorporated herein by reference in its entirety.

BACKGROUND

1. Field

Exemplary embodiments of the present invention relate to a non-volatile memory device and a fabrication method thereof, and more particularly, to a non-volatile memory device that includes a plurality of memory cells stacked vertically from a substrate and a fabrication method thereof.

2. Description of the Related Art

Non-volatile memory devices are memory devices that maintain data stored therein even when a power supply is interrupted. Currently, various non-volatile memory devices, for example, NAND-type flash memories, are widely used.

As an increase in the integration density of two-dimensional memory devices having single-layer memory cells formed on a silicon substrate may reach a limit, three-dimensional non-volatile memory devices having a plurality of memory cells stacked vertically on a silicon substrate may be implemented. Three-dimensional non-volatile memory devices include vertical channel-type devices having a plurality of word lines stacked along channels formed vertically to a substrate, and vertical gate-type devices having a plurality of channel layers deposited along gates formed vertically to a substrate.

Among these three-dimensional non-volatile memory devices, the channel layers of the vertical gate-type devices are deposited on the substrate with an insulating layer interposed there between, and thus the channel layers are connected to the substrate. This structure suggests that a portion functioning like a substrate body is not present in the three-dimensional non-volatile memory devices. Thus, in the three-dimensional non-volatile memory devices, an erase operation may not be performed by applying a high positive voltage to a substrate body having a high-concentration P-type impurity region to inject holes into a gate of the memory cell by Fowler-Nordheim Tunneling. Specifically, the erase operation in the three-dimensional non-volatile memory cell device is performed by applying a high voltage to the gate of a selection transistor of the three-dimensional non-volatile memory device to generate gate-induced drain leakage (GIDL) and supplying hot holes, which are produced by the GIDL current, to the channel.

However, the erase operation employing GIDL current is performed at low erase speed and efficiency and is difficult to achieve.

In addition, a non-volatile memory device comprises a plurality of strings, each including a source selection transistor, a memory cell transistor, and a drain selection transistor, which are connected to each other in series. A first end of the strings are connected to corresponding bit lines, and a second end of the strings are commonly connected to source lines.

However, as the number of strings, which are connected to source lines, increases, the resistance of the source lines due to an increase in current during a read operation is to be reduced.

SUMMARY

An embodiment of the present invention is directed to a vertical gate-type three-dimensional non-volatile memory device and a fabrication method thereof capable of performing an erase operation, and the resistance of source lines in the device is reduced.

In accordance with an embodiment of the present invention, a non-volatile memory device includes: a substrate including a P-type impurity-doped region; a channel structure comprising a plurality of interlayer insulating layers that are alternately stacked with a plurality of channel layers on the substrate; a P-type semiconductor pattern that contacts sidewalls of the plurality of channel layers, wherein a lower end of the P-type semiconductor pattern contacts the P-type impurity-doped region; and source lines that are disposed at both sides of the P-type semiconductor pattern and contact the sidewalls of the plurality of channel layers.

In accordance with another embodiment of the present invention, a method for fabricating a non-volatile memory device includes: forming a P-type impurity-doped region in a substrate; forming a channel structure comprising a plurality of interlayer insulating layers that are alternately stacked with a plurality of channel layers on the substrate; forming a P-type semiconductor pattern that contacts sidewalls of the plurality of channel layers, wherein a lower end of the P-type semiconductor pattern contacts the P-type impurity-doped region; and forming source lines at both sides of the P-type semiconductor pattern that contact the sidewalls of the plurality of channel layers.

In accordance with still another embodiment of the present invention, a non-volatile memory device includes: a substrate; a first peripheral circuit gate formed over the substrate; a channel structure disposed over the first peripheral circuit gate and comprising a plurality of interlayer insulating layers that are alternately stacked with a plurality of channel layers; a P-type semiconductor pattern that contacts sidewalls of the plurality of channel layers, wherein a lower end of the P-type semiconductor pattern contacts the first peripheral circuit gate; and source lines that are disposed at both sides of the P-type semiconductor pattern and contact the sidewalls of the plurality of channel layers.

In accordance with yet another embodiment of the present invention, a method for fabricating a non-volatile memory device includes: forming a first peripheral circuit gate over a substrate; forming a channel structure comprising a plurality of interlayer insulating layers that are alternately stacked with a plurality of channel layers on the substrate that includes the first peripheral circuit gate; forming a P-type semiconductor pattern that contacts sidewalls of the plurality of channel layers, wherein a lower end of the P-type semiconductor pattern contacts the first peripheral circuit gate; and forming source lines at both sides of the P-type semiconductor pattern that contact the sidewalls of the plurality of channel layers.

DETAILED DESCRIPTION

Figure 1:
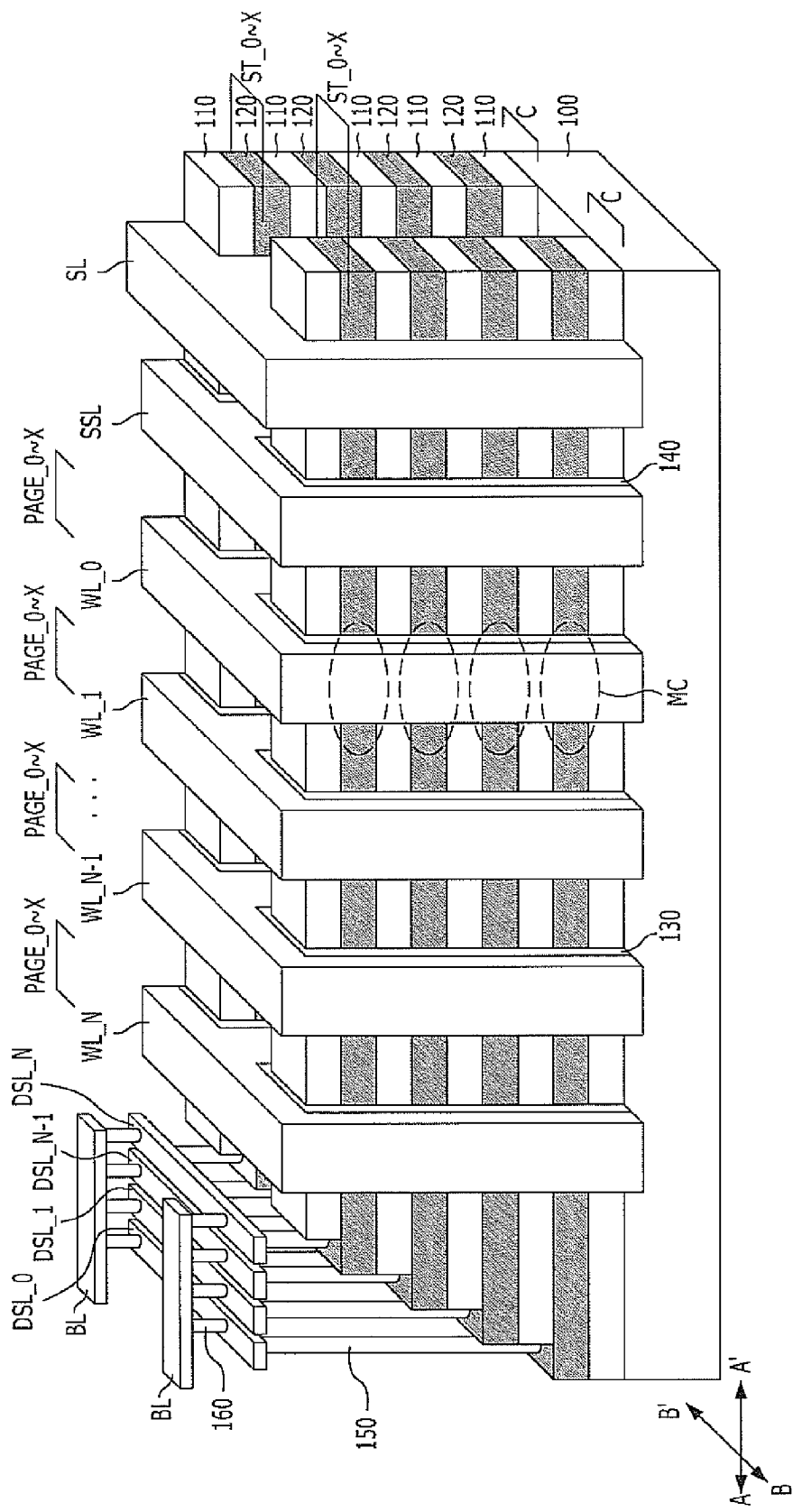
FIG. 1 is a perspective view illustrating a vertical gate-type three-dimensional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, the fundamental structure of a vertical gate-type three-dimensional non-volatile memory device to which embodiments of the present invention may be applied will be briefly described with reference to FIG. 1, and subsequently embodiments of the present invention will be described in detail with reference to FIGS. 2A to 8.

FIG. 1 is a perspective view illustrating a vertical gate-type three-dimensional non-volatile memory device.

Referring to FIG. 1, the vertical gate-type three-dimensional non-volatile memory device comprises a substrate 100, channel structures C disposed on the substrate 100 and extending in a first direction (see A-A'), a plurality of word lines WL_0~WL_N, a source selection line SSL and source lines SL that extend in a second direction (see B-B') crossing the extending direction of the channel structures C and coming into contact with sidewalls of a plurality of channel layers 120 included in the channel structures C, drain selection lines DSL_0~DSL_N disposed on stepped ends of the channel structures C and extending in the second direction, and bit lines BL disposed on the drain selection lines DSL_0~DSL_N and extending in the first direction.

The substrate 100 may be a monocrystalline silicon substrate and may comprise any required structures (not shown) such as wells and insulating layers.

The channel structures C may comprise a plurality of interlayer insulating layers 110 and a plurality of channel layers 120 that are alternately stacked. The interlayer insulating layers 110 may include an oxide or nitride film. The channel layer 120 may be a polysilicon film or monocrystalline silicon film doped with a P- or N-type impurity. The plurality of channel structures C may be arranged in parallel and separated from each other. The channel structures C may have a stepped shape at ends thereof.

The plurality of word lines WL_0~WL_N may be arranged separated from each other in parallel and extending in the second direction. A first portion of the word lines WL_0~WL_N are disposed on the channel structures C and extend in the second direction, and a second portion of the word lines WL_0~WL_N extend vertically downward from the first portion toward the substrate 100. As a result of this structure, the second portion comes into contact with the sidewalls of the channel structures C. A memory film 130 (as described below) may be interposed between the sidewalls of the channel structures C and the second portion of the word lines WL_0~WL_N. The word lines WL_0~WL_N may comprise a conductive material, for example, a semiconductor material such as a polysilicon doped with an impurity, or a metal material.

The memory film 130 is interposed between the word lines WL_0~WL_N and the channel structures C and electrically insulates the word lines WL_0~WL_N and the channel structures C. The memory film 130 may also trap charges to substantially store date. This memory film 130 may comprise a triple film of a tunnel insulating film, a charge trapping film, and a charge blocking film. The tunnel insulating film is disposed adjacent to the channel structures C and may be, for example, an oxide film. The charge blocking film is disposed adjacent to the word lines WL_0~WL_N and may be, for example, an oxide film. Also, the charge trapping film is disposed between the tunnel trapping film and the charge blocking film and may be, for example, a nitride film.

The source selection line SSL extends in the second direction in parallel with the word lines WL_0~WL_N and is placed between the word lines WL_0~WL_N and the source line SL. The source selection line SSL may have the same structure as the word lines WL_0~WL_N, which was described above. However, a gate insulating film 140 (as described above), rather than a memory film 130 is interposed between the sidewalls of the channel structures C and the source selection line SSL. The source selection line SSL may comprise a conductive material, for example, a semiconductor material such as a polysilicon doped with an impurity, or a metal material.

The gate insulating film 140 may be interposed between the source selection line SSL and the channel structures C and may be, for example, an oxide film.

The source line SL extends in the second direction in parallel with the source selection line SSL. Similar to the word lines WL_0~WL_N or the source selection line SSL, the source line SL may have a first portion disposed on the channel structures C and extending in the second direction and a second portion protruding vertically downward from the first portion toward substrate 100. However, the vertical height of the source line SL may differ from that of the word lines WL_0~WL_N or the source selection line SSL. The source line SL may comprise a conductive material, for example, a semiconductor material such as a polysilicon doped with an impurity, or a metal material.

The drain selection lines DSL_0~DSL_N are disposed on the stepped ends of the channel structures C and extend in the second direction. The drain selection lines DSL_0~DSL_N connect drain selection transistors (not shown), which are arranged in the second direction, to each other. Specifically, on the stepped end of each channel layer 120, a channel contact 150 is formed, and on each channel contact 150, a channel 160 of the drain selection transistor is disposed. The drain selection lines DSL_0~DSL_N surround the channels 160 of the drain selection transistors with a gate insulating film (not shown) interposed therebetween The bit lines BL are disposed on the drain selection lines DSL_0~DSL_N and extend in the first direction. The bit lines BL are connected to the channels 160 of the drain selection transistors. In FIG. 1, the bit lines BL are shown as disposed only on the stepped ends of the channel structures C, but the bit lines BL may extend in the first direction across and above the word lines WL_0~WL_N, the source selection line SSL, and the source line SL.

Although not shown in FIG. 1, elements disposed at the left side of the source line SL may be symmetrically arranged at the right side of the source line SL.

The non-volatile memory device as described above includes a plurality of unit memory cells MC each comprising a channel layer 120, a word line WL, and a memory film 130 interposed between the channel layer and the word line.

The plurality of memory cells MC may be vertically stacked and horizontally arranged in a matrix form in the first and second directions.

Here, the plurality of memory cells MC sharing the same channel layer 120 constitute one string ST. Stacked strings ST_0~X sharing the same channel structure C are connected to the same bit line BL. Also, the plurality of stacked strings ST_0~X, which are connected to the plurality of bit lines BL, are commonly connected to one source line SL.

The plurality of memory cells MCs sharing the same word line WL constitute one PAGE, and thus PAGEs (PAGE_0~X) are disposed for each word line WL. Among the stacked PAGEs (PAGE_0~X) sharing one word line WL, desired PAGES can be selected by the drain selection transistors.

The read/write operation of the non-volatile memory device having the above-described structure can be performed by controlling the word lines WL_0~WL_N and the bit lines BL according to a conventional method while selecting PAGEs using a plurality of drain selection transistors. In other words, PAGEs can be selected by turning on the drain selection transistors connected to the desired PAGEs during the read/write operation and turning-off other drain selection transistors.

The erase operation of the non-volatile memory device having the above-described structure can be performed by applying a high voltage to the source selection line SSL to generate GIDL current and supplying hot holes, which are produced by the GIDL current, to the channel layers 120. However, this erase operation method can be performed at low erase efficiency as described above. Also, in the non-volatile memory device having the above-described structure, the plurality of stacked strings ST_0~X connected to the plurality of bit lines are commonly connected to one source line SL. In other words, because the plurality of strings ST are connected to one source line SL, the resistance of the source lines SL is to be reduced. A structure that can increase erase efficiency while reducing the resistance of the source lines will now be described in detail with reference to FIGS. 2A to 8.

Figure 2A:
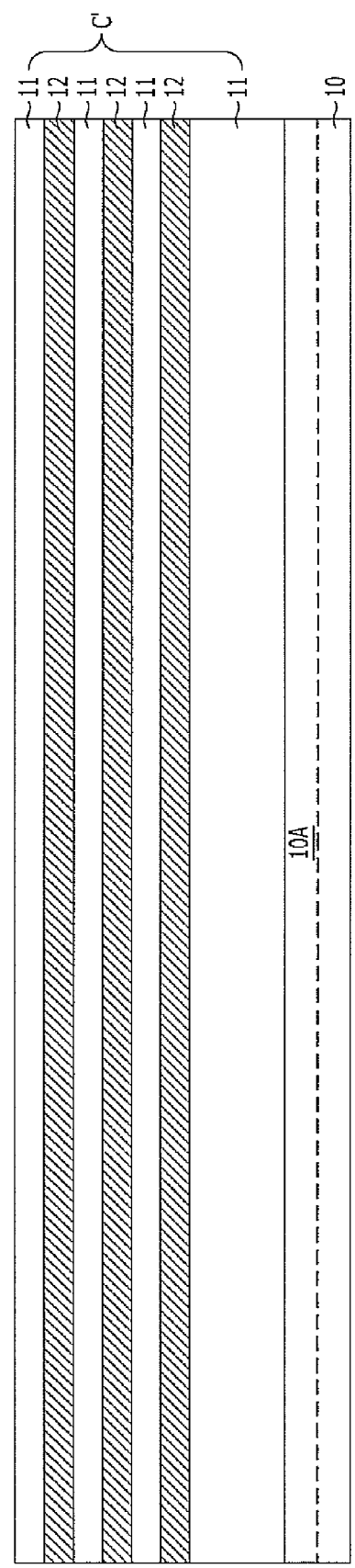
FIGS. 2A to 2F illustrate a non-volatile memory device in accordance with a first embodiment of the present invention and a fabrication method thereof.
Figure 2B:
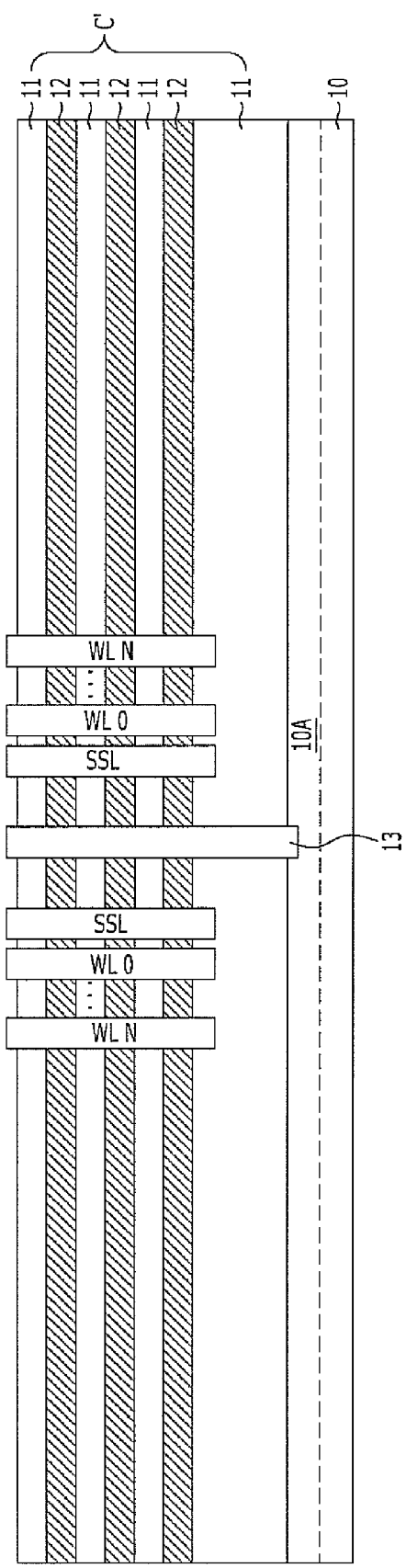
Figure 2C:
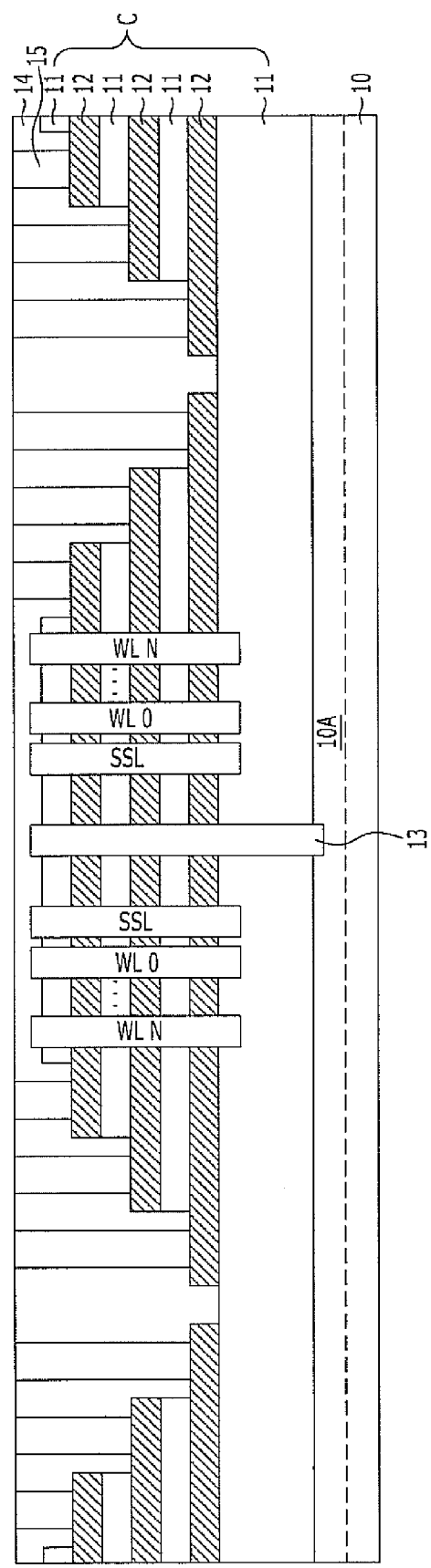
Figure 2D:
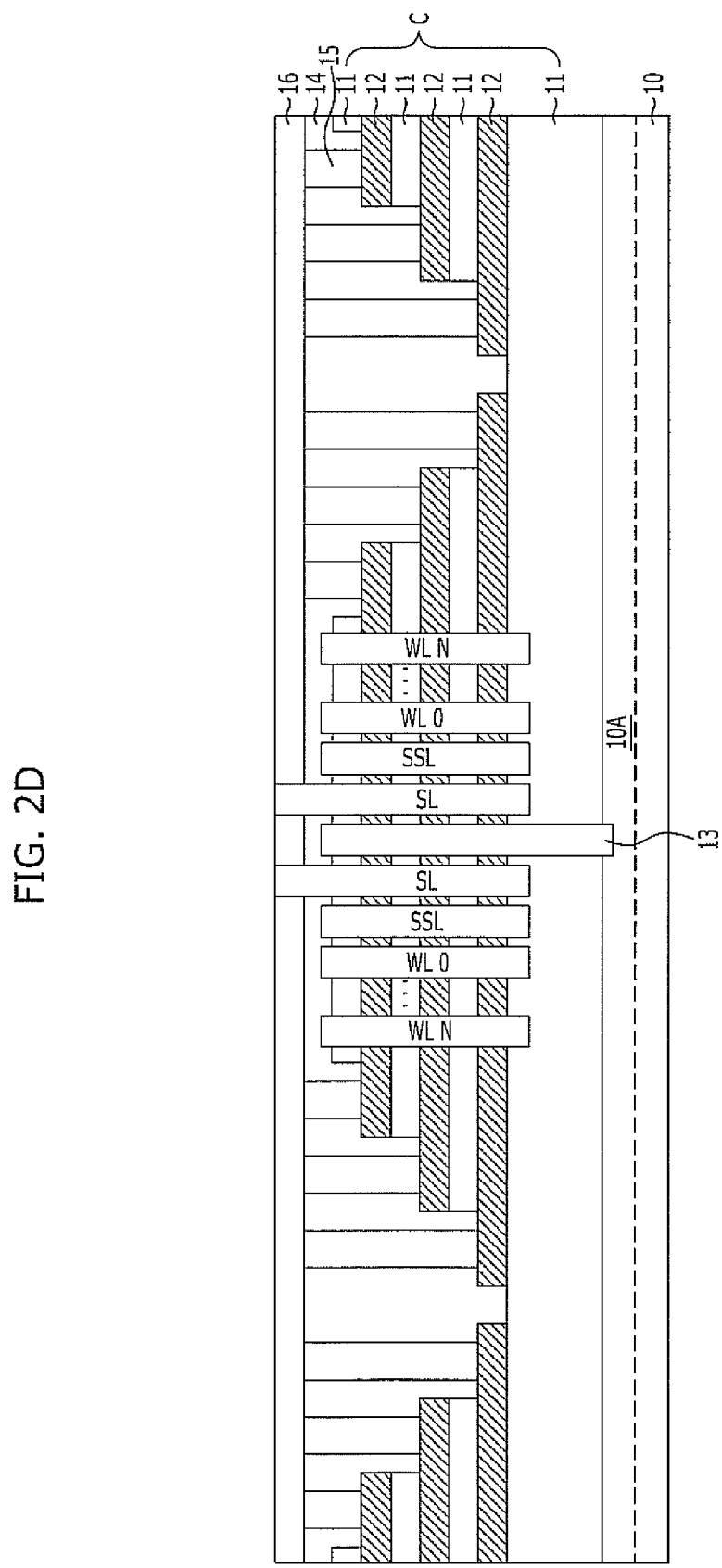
Figure 2E:
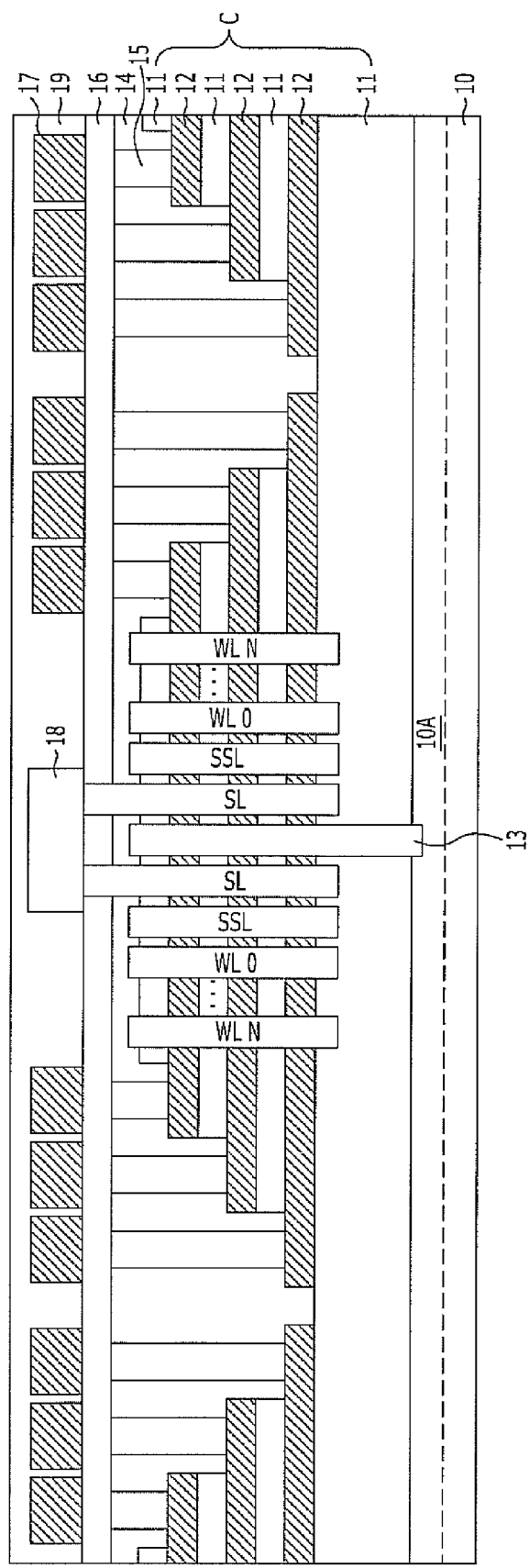
Figure 2F:
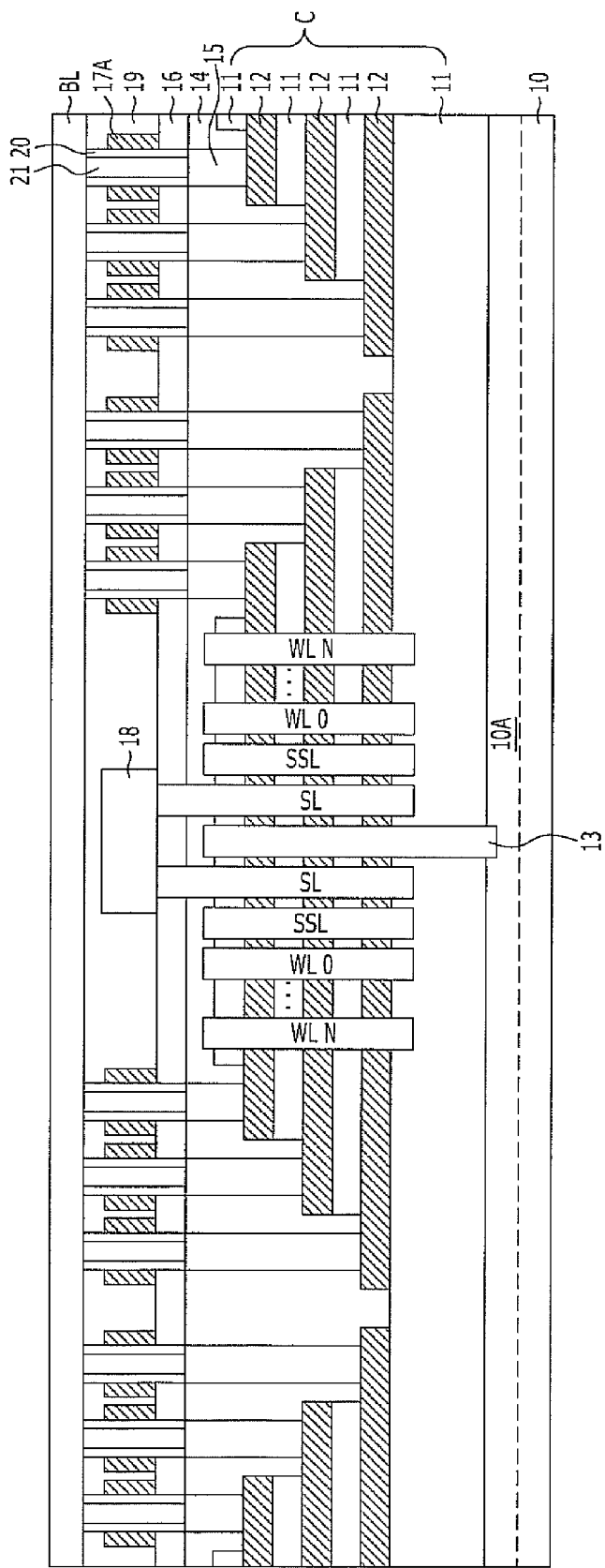

FIGS. 2A to 2F are views illustrating a non-volatile memory device according to a first embodiment of the present invention and a fabrication method thereof. Particularly, FIG. 2F shows the non-volatile memory device according to the first embodiment of the present invention, and FIGS. 2A to 2E show examples of intermediate steps of a process for fabricating the device of FIG. 2F. These figures are a cross-sectional view taken along line A-A' of FIG. 1. The following description will be made while focusing on elements different from those of the device of FIG. 1.

Referring to FIG. 2A, a P-type impurity is doped into a substrate 10 to form a P-type impurity-doped region 10A.

The substrate 10 may be a semiconductor substrate such as a silicon substrate.

The P-type impurity-doped region 10A may be formed on an upper portion of the substrate by doping with an impurity of relatively high concentration. In this embodiment, the P-type impurity-doped region 10A is formed throughout the upper portion of the substrate 10, but the scope of the present invention is not limited thereto, and the P-type impurity-doped region 10A may be formed only in a designated region, for example, a region coming into contact with a P-type semiconductor pattern as described below.

Subsequently, a plurality of interlayer insulating layers 11 and a plurality of channel layers 12 are alternately formed on the substrate 10 that includes the P-type impurity-doped region 10A. The plurality of interlayer insulating layers 11 and a plurality of channel layers 12 are patterned to form an initial channel structure C' extending in the first direction. Although not shown, a plurality of initial channel structures C' may be arranged in parallel in the second direction.

Subsequently, an insulating film (not shown) is formed between the plurality of initial channel structures C'.

Referring to FIG. 2B, a P-type semiconductor pattern 13 is formed. The P-type semiconductor pattern contacts the sidewalls of the initial channel structures C'. A lower end of the P-type semiconductor pattern may also contact the P-type impurity-doped region 10A.

Figure 3A:
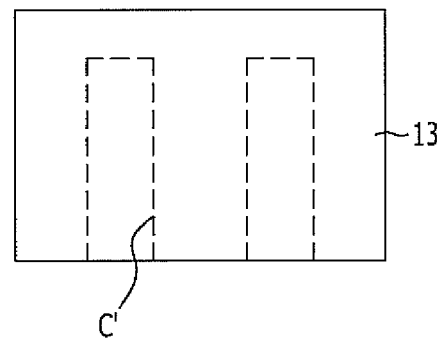
FIGS. 3A to 3C illustrate the shapes of a P-type semiconductor pattern.
Figure 3B:
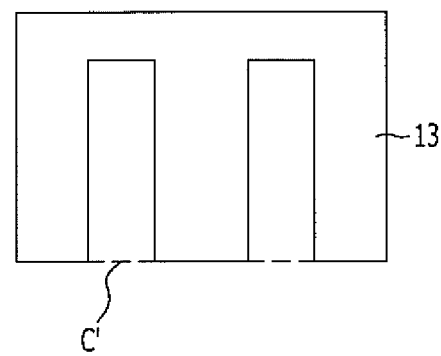
Figure 3C:
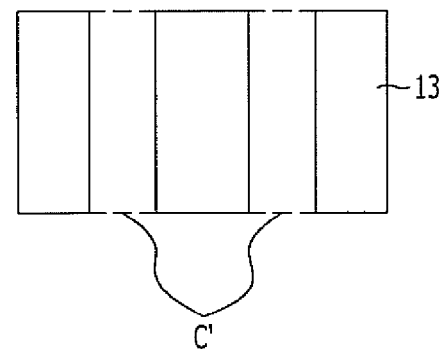

Here, the P-type semiconductor pattern 13 may, for example, be formed to have any one of the shapes shown in FIGS. 3A to 3C. FIGS. 3A to 3C show the cross-sections of the P-type semiconductor pattern 13 in the second direction.

Specifically, as shown in FIG. 3A, the P-type semiconductor pattern 13 may be formed to have a line shape which passes through the initial channel structure C' and extends in the second direction. This P-type semiconductor pattern 13 can be formed by forming a mask pattern (not shown), which exposes a region where the P-type semiconductor pattern is to be formed, on the plurality of initial channel structures C' and the insulating film filling between the initial channel structures, etching the initial channel structures C' and the insulating film using the mask pattern as an etch barrier until the P-type impurity-doped region 10A is exposed to form trenches, and filling the trenches with a P-type semiconductor material.

Alternatively, as shown in FIG. 3B, the P-type semiconductor pattern 13 may be formed to have a first portion disposed on the initial channel structures C' and a second portion protruding vertically downward from the first portion. This P-type semiconductor pattern 13 can be formed by forming a mask pattern (not shown), which exposes a region where the P-type semiconductor pattern is to be formed, on the plurality of initial channel structures C' and the insulating film filling between the initial channel structures, etching the insulating film excluding the initial channel structures C' using the mask pattern as an etch barrier until the P-type impurity-doped region 10A is exposed to form trenches, and filling the trenches with a P-type semiconductor material.

Alternatively, as shown in FIG. 3C, the P-type semiconductor pattern 13 may also have a pillar shape that is disposed between the initial channel structures C'. This P-type semiconductor pattern 13 can be formed by forming a mask pattern (not shown), which exposes a region where the P-type semiconductor pattern is to be formed, on the plurality of initial channel structures C' and the insulating film filling between the initial channel structures C', etching the insulating film excluding the initial channel structures C' by using the mask pattern as an etch barrier until the P-type impurity-doped region 10A is exposed to form trenches, filling the trenches with a P-type semiconductor material, and etching back the P-type semiconductor material until the interlayer insulating layer 11 at an uppermost portion of the initial channel structures C' is exposed.

However, the shape of the P-type semiconductor pattern 13 is not limited to the above-illustrated shapes and may be any shape that contacts the plurality of channel layers 12 included in the initial channel structures C' and contacts the P-type impurity-doped region 10A at a lower end.

After the trench formation process for forming the P-type semiconductor pattern 13, but before filling the trenches with the P-type semiconductor material, a P-type impurity may additionally be doped into the P-type impurity-doped region 10A exposed through the trenches. This additional doping is performed to compensate for the loss of the impurity in the P-type impurity-doped region 10A that occurs in the etching process for forming the trenches. The additional doping of the P-type impurity can be performed by ion implantation or plasma doping.

Also, the impurity concentration of the P-type semiconductor pattern 13 may be lower than the impurity concentration of the P-type impurity-doped region 10A. This is because the P-type semiconductor pattern 13 directly contacts the channel layers 12, and thus, if the P-type semiconductor pattern 13 has high impurity concentration, current leakage may occur.

Even when the P-type semiconductor pattern 13 is a low impurity concentration as described above, an erase operation is not adversely affected because the P-type semiconductor pattern 13 can sufficiently receive holes from the P-type impurity-doped region 10A during the erase operation.

Subsequently, a source selection line SSL and a plurality of word lines WL_0~WL_N are formed at both sides of the P-type semiconductor pattern 13. The plurality of word lines WL_0~WL_N and the source selection line SSL may be formed such that they are symmetrically arranged at both sides of the P-type semiconductor pattern 13. Also, each of the word lines WL_0~WL_N and the source selection line SSL may be formed to have a first portion disposed on the initial channel structures C' and extending in the second direction and a second portion protruding vertically downward from the extending portion. Here, the second portion has a height such that the second portion of the word lines WL_0~WL_N and the source selection line SSL contacts the plurality of channel layers 12 while the lower end thereof does not contact with the P-type impurity-doped region 10A.

Such word lines WL_0~WL_N and source selection lines SSL may, for example, be formed in the following manner. First, a mask pattern (not shown), which exposes regions where the word lines WL_0~WL_N and the source selection lines are to be formed, is formed on the plurality of initial channel structures C' and the insulating film filling between the initial channel structures. Using the mask pattern as an etch barrier, the insulating film excluding the initial channel structures C' is etched to such a depth that the sidewalls of the plurality of channel layers 12 are completely exposed while the P-type impurity-doped region 10A is not exposed, and trenches for the word lines and trenches for the source selection lines are formed. Subsequently, a memory membrane 130 (see FIG. 1) is formed in the trenches for the word lines, and a gate insulating film 140 (see FIG. 1) is formed in the trenches for the source selection lines. Next, the trenches are filled with a conductive material.

This embodiment illustrates that the P-type semiconductor pattern 13 is formed before the word lines WL_0~WL_N and the source selection line SSL are formed, but the scope of the present invention is not limited thereto. The word lines WL_0~WL_N and the source selection lines SSL may be formed before the P-type semiconductor pattern 13 is formed. Alternatively, the word lines WL_0~WL_N and the source selection lines SSL may also be formed simultaneously with the P-type semiconductor pattern 13.

Referring to FIG. 2C, the initial channel structures C', which excludes the regions in which the word lines WL_0~WL_N, the source selection line SSL and the P-type semiconductor pattern 13 were formed, is etched to form channel structures C. Both ends of the channel structures C have a stepped shape. The phrase "both ends of channel structures C have a stepped shape" means that any one channel layer 12 extends more than the overlying channel layer 12 in the horizontal direction. An etching method for forming the channel structures C is well known in the art, and thus the detailed description thereof will be omitted.

Subsequently, a first insulating layer 14 covering the resulting structure including the stepped ends is formed. Subsequently, the first insulating layer 14 is selectively etched to form contact holes exposing the protruding ends of each of the channel layers 12, and a conductive material is filled in the contact holes, thereby forming channel contacts 15 on the ends of each of the channel layers 12.

Referring to FIG. 2D, a second insulating layer 16 is formed on the structure resulting from the process of FIG. 2C. Subsequently, source lines SL are formed and disposed between the P-type semiconductor pattern 13 and the source selection line SSL at the left side thereof and between the P-type semiconductor pattern 13 and the source selection line SSL at the right side thereof, respectively. The source lines SL pass through the first insulating layer 14 and the second insulating layer 16 to contact the sidewalls of the channel structures C. Similar to the word lines WL_0~WL_N and the source selection lines SSL, the source line SL may be formed to have a first portion disposed on the channel structures C and extending in the second direction and a second portion extending vertically downward from the first portion toward the space between the channel structures C. Here, the second portion has a height such that it comes into contact with the sidewalls of the plurality of channel layers 12 while a lower end of the second portion does not come into contact with the P-type impurity-doped region 10A.

This source lines SL may, for example, be formed in the following manner. First, a mask pattern (not shown) is formed on the second insulating layer 16, and the mask pattern exposes regions where the source lines SL are to be formed. Using the mask pattern as an etch barrier, the second insulating layer 16 and the first insulating layer 14, excluding the channel structures C, are etched to such a depth that the sidewalls of the plurality of channel layers 12 are completely exposed while the P-type impurity-doped region 10A is not exposed, and trenches for the source lines are formed. Subsequently, a conductive material such as an impurity-doped semiconductor material is filled in the trenches for the source lines.

In this embodiment, the source lines are formed after formation of the second insulating layer 16. In this case, because a source line-connecting portion as described below can be formed such that it directly contacts the source line SL, a separate process for forming contacts between the source lines can be omitted, and thus, the device fabrication process is simplified. In addition, the source line-connecting portion can be formed together with a conductive layer for drain selection lines as described below, and thus, the device fabrication process can further be simplified. However, the scope of the present invention is not limited thereto. The source lines SL may be formed together with the word lines WL_0~WL_N, and the source selection lines SSL shown in FIG. 2B may also be formed after the step shown in FIG. 2D. The source lines SL may have various heights depending when they are formed.

Referring to FIG. 2E, a conductive layer pattern 17 for drain selection lines and a source line-connecting portion 18 are formed on the source lines SL and the second insulating layer 16. Here, the conductive layer pattern 17 for drain selection lines is disposed above the corresponding channel contacts 15. The source line-connecting portion 18 serves to connect the two source lines, which are disposed at both sides of the P-type semiconductor pattern 13, and may have any shape that contacts the upper ends of the two source lines SL to connect the source lines to each other.

Here, the conductive layer pattern 17 for drain selection lines and the source line-connecting portion 18 may be formed simultaneously by a process of depositing a conductive material on the second insulating layer 16 and patterning the deposited material, but the scope of the present invention is not limited thereto.

Subsequently, a third insulating layer 19 is formed. The third insulating layer 19 covers the conductive layer pattern 17 and the source line-connecting portion 18.

Referring to FIG. 2F, the third insulating layer 19, the conductive layer pattern 17 for drain selection lines, and the second insulating layer 16 are selectively etched to form contact holes that expose the channel contacts 15, respectively. A gate insulating film 20 for drain selection transistors is formed on a sidewall of the contact hole, and a channel material, for example, a semiconductor material, is filled in the contact hole having the gate insulating film 20 therein. By forming the gate insulating film 20 and the channel material, a channel 21 of a drain selection transistor may be formed. The conductive layer pattern 17 for drain selection lines, which are etched in this process, forms drain selection lines 17A.

Subsequently, a conductive film is deposited on the third insulating layer 19 and patterned to form bit lines BL, which are connected to the channels of drain selection transistors arranged in the first direction. The bit lines may extend in the first direction.

The non-volatile memory device as shown in FIG. 2F can be fabricated by the above-described steps and can have the following effects.

Referring to FIG. 2F, the P-type semiconductor pattern 13 contacts the plurality of channel layers 12 and the lower end of the P-type semiconductor pattern is connected to the P-type impurity-doped region 10A formed in the substrate 10. More specifically, the channel layers are connected through the P-type semiconductor pattern 13 to the P-type impurity-doped region 10A of the substrate 10.

Thus, the non-volatile memory device of the present invention may perform an erase operation by applying high positive voltage to the P-type impurity-doped region 10A to inject holes directly into the channel layers 12. However, unlike the prior art, the non-volatile memory device of the present invention but does not employ GIDL current to perform the erase operation. Thus, the non-volatile memory device can perform an erase operation in an efficient manner.

However, the first embodiment as described above does not mention a method of reducing the resistance of the source lines. Hereafter, a device and a fabrication method thereof, which can reduce the resistance of the source lines SL while increasing the erase efficiency as described in the first embodiment, will be described with reference to FIGS. 4A to 7C.

Figure 4A:
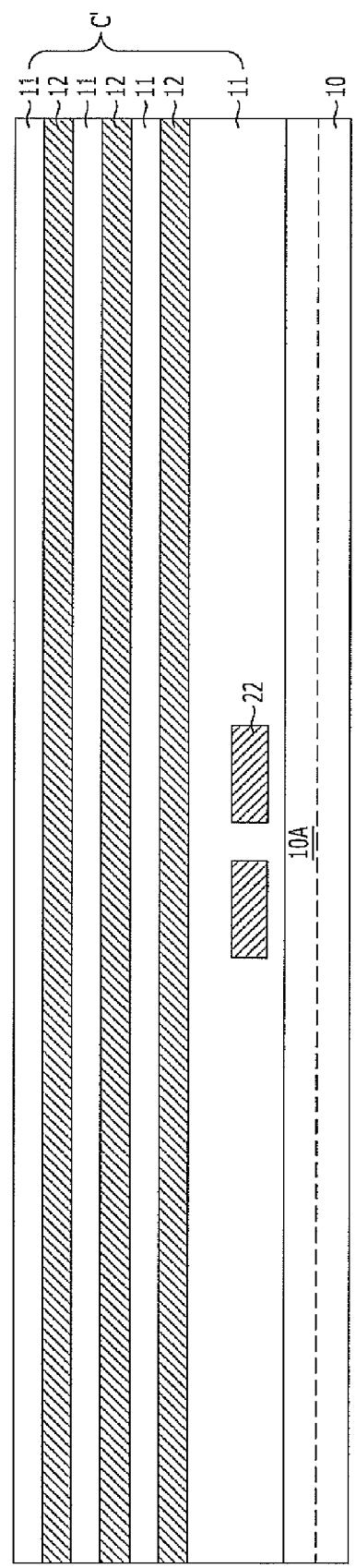
FIGS. 4A to 4C illustrate a non-volatile memory device in accordance with a second embodiment of the present invention and a fabrication method thereof.
Figure 4B:
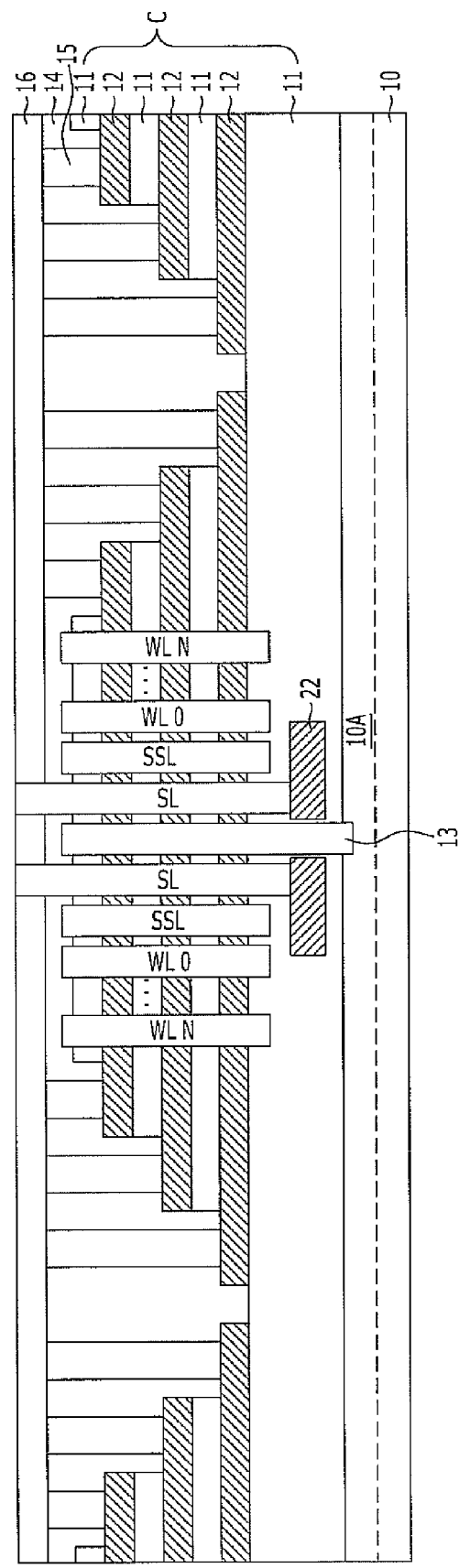
Figure 4C:
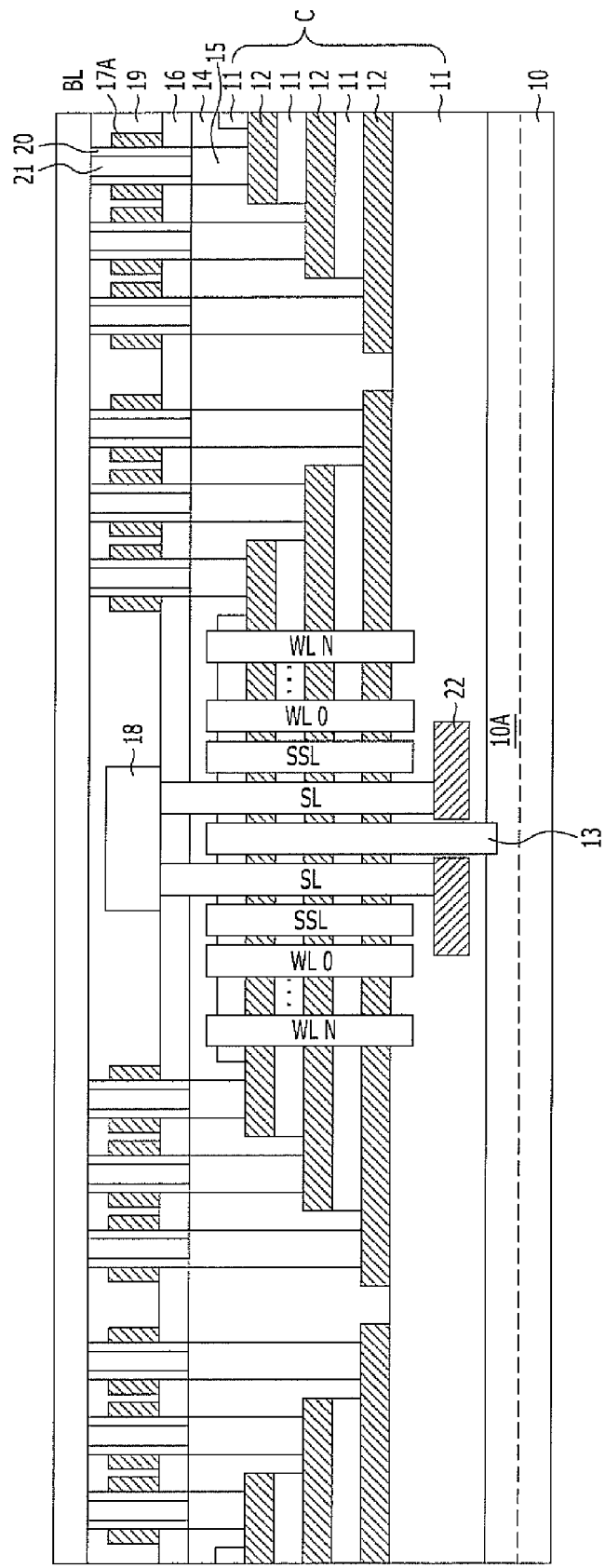

FIGS. 4A to 4C are views illustrating a non-volatile memory device according to a second embodiment of the present invention and a fabrication method thereof. Particularly, FIG. 4C illustrates the non-volatile memory device according to the second embodiment of the present invention, and FIGS. 4A and 4B illustrate examples of intermediate steps of a process for manufacturing the device of FIG. 4C. This embodiment will be described while focusing on the differences from the first embodiment.

Referring to FIG. 4A, a P-type impurity is doped into a substrate 10 to form a P-type impurity-doped region 10A.

A gate insulating film (not shown) is formed on the substrate 10. Subsequently, a conductive film is deposited on the substrate 10 and patterned to form a gate of a peripheral circuit transistor. Here, the gate 22 is formed on the substrate region excluding a region in which a P-type semiconductor pattern is to be formed, such that the P-type semiconductor pattern is connected to the P-type impurity-doped region 10A.

Subsequently, a plurality of interlayer insulating layers 11 and a plurality of channel layers 12 are alternately formed on the substrate 10 and patterned, thereby forming initial channel structures C' extending in the first direction. Here, the lowermost interlayer insulating layer 11 can be formed to completely cover the gate 22.

In 2-dimensional non-volatile memory devices, a semiconductor substrate is used as a channel for memory cells. However, in 3-dimensional non-volatile memory devices as described in this embodiment, the substrate 10 is not part of memory cells. In other words, the memory cells are formed on the substrate 10, and a peripheral circuit region may be provided between a cell region where memory cells are formed. Accordingly, various peripheral circuit devices such as the gate 22 of peripheral circuit transistors can be disposed between the substrate 10 and the initial channel structures C'.

Subsequently, a P-type semiconductor pattern 13, source selection lines SSL, and a plurality of word lines WL_0~WL_N are formed. The initial channel structures C' are etched to form channel structures C, and both ends of the channel structures C have a stepped shape. Subsequently, a first insulating layer 14 and channel contacts 15 are formed according to the same process described in the first embodiment (see FIGS. 2B and 2C).

Referring to FIG. 4B, a second insulating layer 16 is formed on the channel contacts 15 and the first insulating layer 14. After forming the second insulating layer 16 and the channel contacts 15, source lines SL are formed and disposed between the P-type semiconductor pattern 13 and the left-side source selection line SSL and between the P-type semiconductor pattern 13 and the right-side source selection line SSL, respectively. The source lines SL pass through the first insulating layer 14 and the second insulating layer 16 to contact sidewalls of the channel structures C. Similar to the word lines WL_0~WL_N and the source selection lines SSL, the source lines may be formed to have a first portion disposed on the channel structures C and extending in the second direction and a second portion extending vertically downward from the first portion toward the space between the channel structures C.

Here, the second portion of the source line SL is formed to contact the sidewalls of the channel layers 12 while the lower end of the second portion of the source line SL comes into contact with the gate 22. The gate 22 is a portion of a peripheral circuit transistor and may be made of a low-resistance material such as a metal or metal silicide. In addition, the gate 22 may have a relatively large size. Thus, the resistance of the source lines SL can be reduced by connecting the source lines SL to this low-resistance gate 22.

These source lines SL may, for example, be formed in the following method. First, on the second insulating layer 16, a mask pattern (not shown) is formed that exposes regions where the source lines SL are to be formed. Using the mask pattern as an etch barrier, the second insulating layer 16 and the first insulating layer 14 are etched to such a depth that the sidewalls of the plurality of channel layers 12 are completely exposed and the gate is exposed, thereby forming trenches for the source lines. Subsequently, a conductive material such as an impurity-doped semiconductor material is filled in the trenches for source lines.

Referring to FIG. 4C, a source line-connecting portion 18, drain selection transistors 17A, 20, and 21, and bit lines BL are formed according to the same process described in the first embodiment (see FIGS. 2E and 2F).

The non-volatile memory device as shown in FIG. 4C can be fabricated by the above-described steps. In the second embodiment of the non-volatile memory device, the lower end of the source lines SL is connected to the gate 22 for peripheral circuit transistors, which are disposed blow the channel structures C. Thus, the erase efficiency of the device can be increased and the resistance of the source lines SL can be reduced.

Figure 5A:
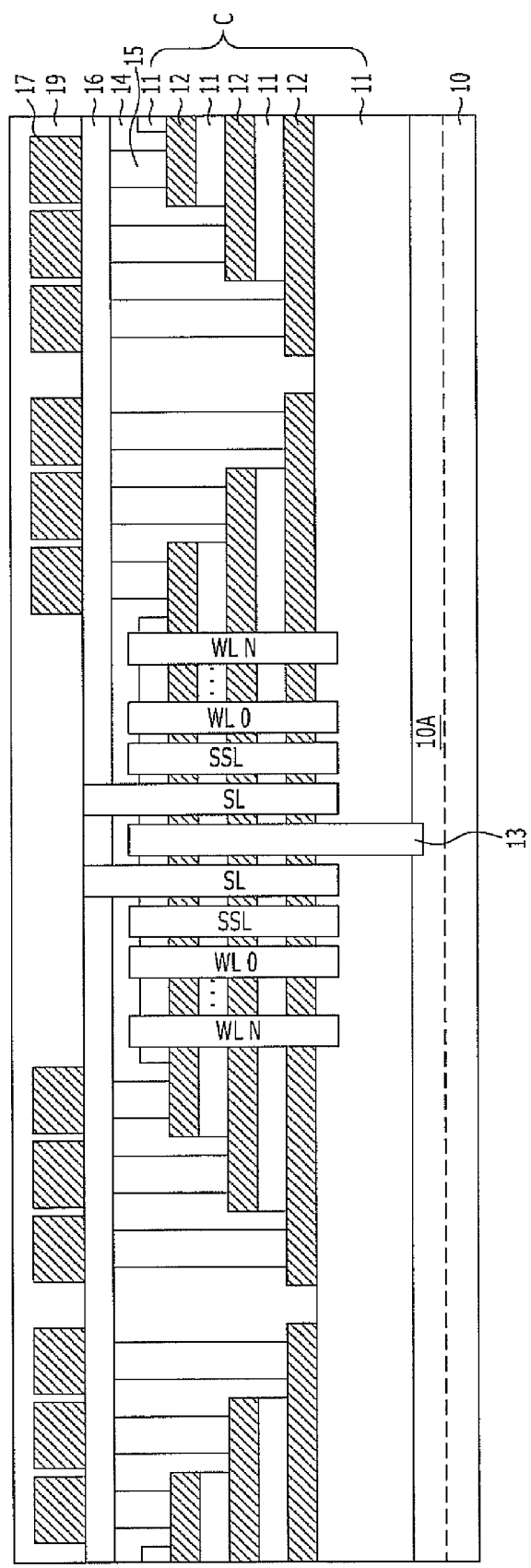
FIGS. 5A to 5D illustrate a non-volatile memory device in accordance with a third embodiment of the present invention and a fabrication method thereof.
Figure 5B:
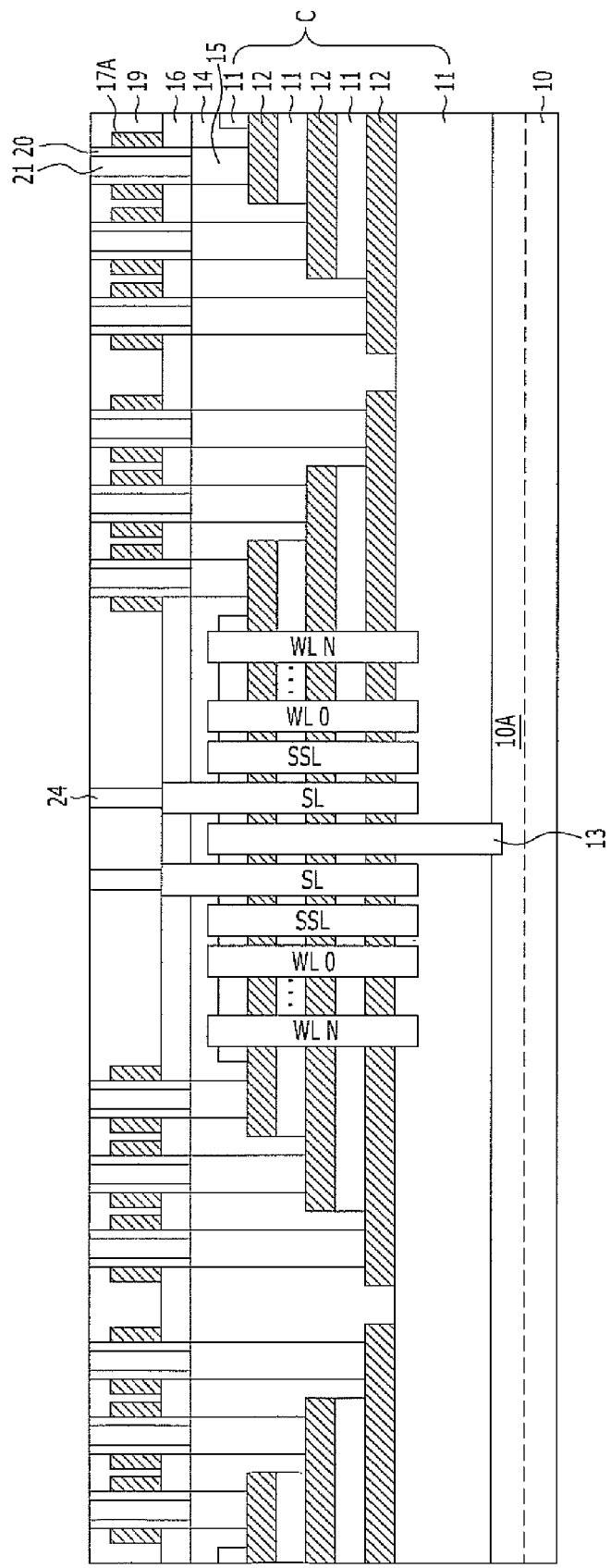
Figure 5C:
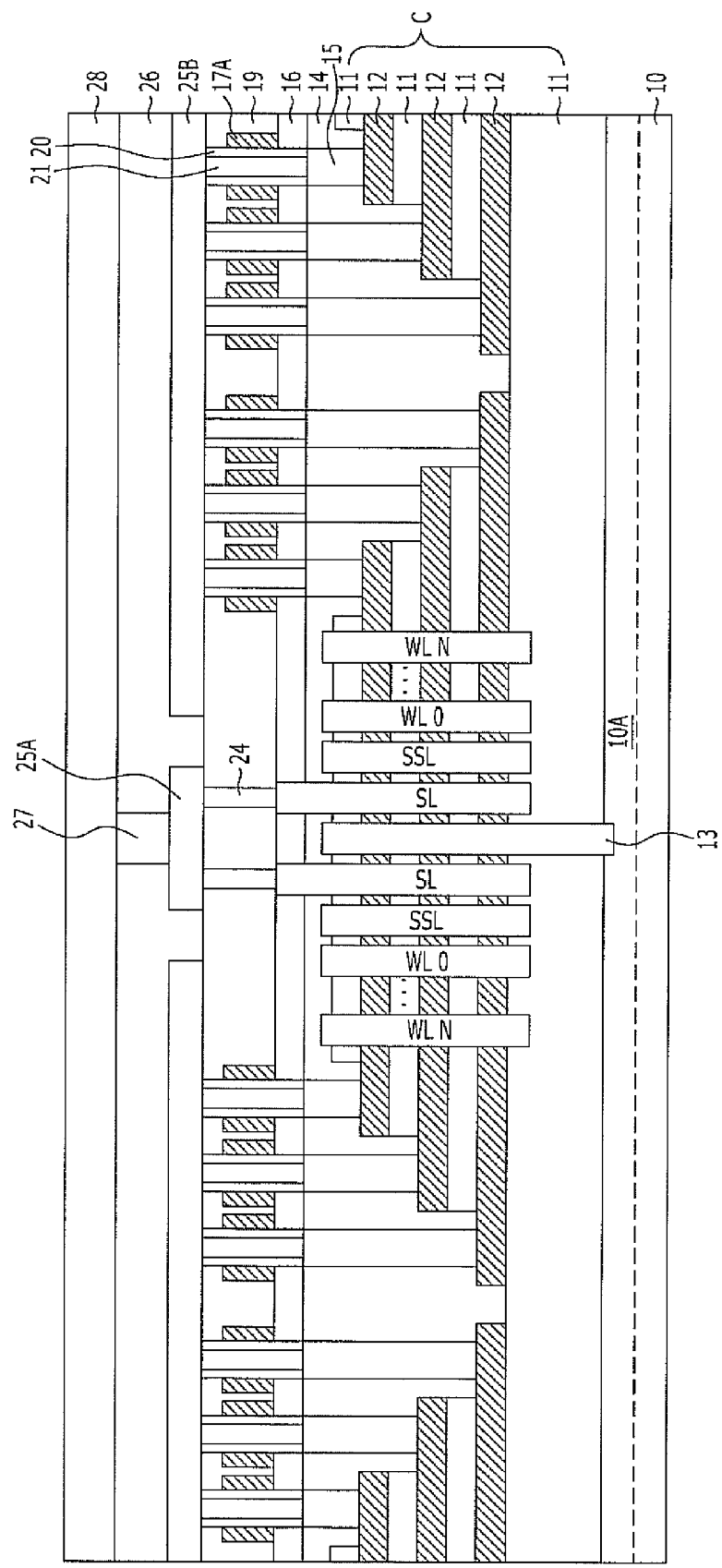
Figure 5D:
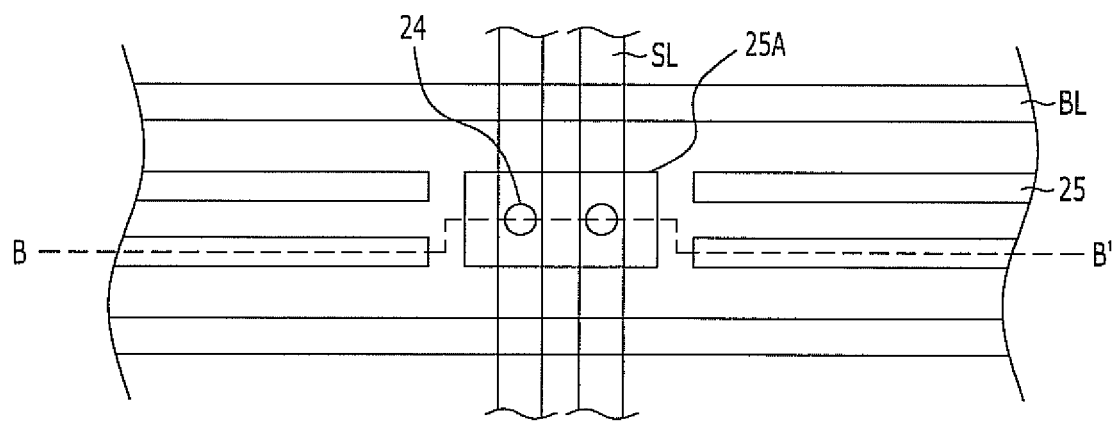

FIGS. 5A to 5D are views illustrating a non-volatile memory device according to a third embodiment of the present invention and a fabrication method thereof. Particularly, FIG. 5C illustrates the non-volatile memory device according to the third embodiment of the present invention, and FIGS. 5A and 5B illustrate examples of intermediate steps of a process for fabricating the device of FIG. 5C. FIG. 5D is a top view showing some of the elements shown in FIG. 5C, and FIGS. 5A to 5C are cross-sectional views taken along line B-B' of FIG. 5D. If necessary, FIGS. 5A to 5C will be referred to simultaneously. This embodiment will be described while focusing the differences from the first embodiment.

Referring to FIG. 5A, the same process as shown in FIGS. 2A to 2D for the first embodiment is carried out, and a conductive layer pattern 17 for drain selection lines is subsequently formed on the resulting structure.

Subsequently, a third insulating layer 19 covering the conductive layer pattern for drain selection lines is formed.

Referring to FIG. 5B, the third insulating layer 19, the conductive layer pattern 17 for drain selection lines 17, and the second insulating layer 16 are selectively etched to form contact holes that expose the channel contacts, respectively. Subsequently, a gate insulating film 20 for drain selection transistors is formed on a sidewall of the contact hole, and the contact holes having the gate insulating film 20 formed therein are filled with, for example, a semiconductor material. By forming the gate insulating film 20 and the channel material, channels 21 of drain selection transistors may be formed. In this embodiment, the etched conductive layer pattern 17 forms drain selection lines 17A.

Also, the third insulating layer 19 is selectively etched to form at least two contact holes that expose two source lines SL, respectively. Subsequently, a conductive material is filled in the contact holes to form at least two first contacts 24, which are connected to the two source lines SL, respectively. In this embodiment, two first contacts 24 are shown, but three or more first contacts 24 may be formed.

Referring to FIGS. 5C and 5D, a conductive film is deposited on the third insulating layer 19 and patterned to form bit lines BL, which are connected to the channels 21 of drain selection transistors arranged in the first direction. The bit lines BL may also extend in the first direction. A pad 25A is formed and disposed on at least two first contacts 24 to contact the first contacts. The bit lines BL are cut and spaced apart from the pad 25A. The cut bit lines BL are indicated by reference numeral 25B and referred to as "dummy bit line", because they no longer function as bit lines (BL). Of course, bit lines BL other than the dummy bit line 25B will function as conventional bit lines BL.

In this embodiment, two source lines SL can be connected to each other by forming the pad 25A above the first contacts. Because the pad 25A can be formed in the process of forming the bit lines BL, a separate process of forming a bit line-connecting portion is not required, and thus the device fabrication process is simplified.

Subsequently, a fourth insulating layer 26 covering the bit lines BL, the pad 25A, and the dummy bit line 25B is formed. After forming the fourth insulating layer 26, a second contact is formed that passes through the fourth insulating layer 26 to connect to the pad 25A.

Subsequently, a conductive material is deposited on the fourth insulating layer and patterned to form a metal wiring line 28, which is connected to the second contact 27 and extends in a given direction. The metal wiring line 28 may be formed of a low-resistance material such as a metal or metal silicide and have large size. Because the source lines SL are connected to this low-resistance metal wiring line 28 through the first contacts 24, the pad 25A, and the second contact 27, the resistance of the source lines SL may be reduced.

The non-volatile memory device as shown in FIG. 5C can be fabricated by the above-described steps. However, in the third embodiment, the upper ends of the source lines SL are connected to each other by the pad 25A while they are connected to the metal wiring line 28 through the second contact 27. Thus, similar to the device shown in FIG. 2F, the erase efficiency of the device may be increased, and the resistance of the source lines SL can be reduced.

Figure 6A:
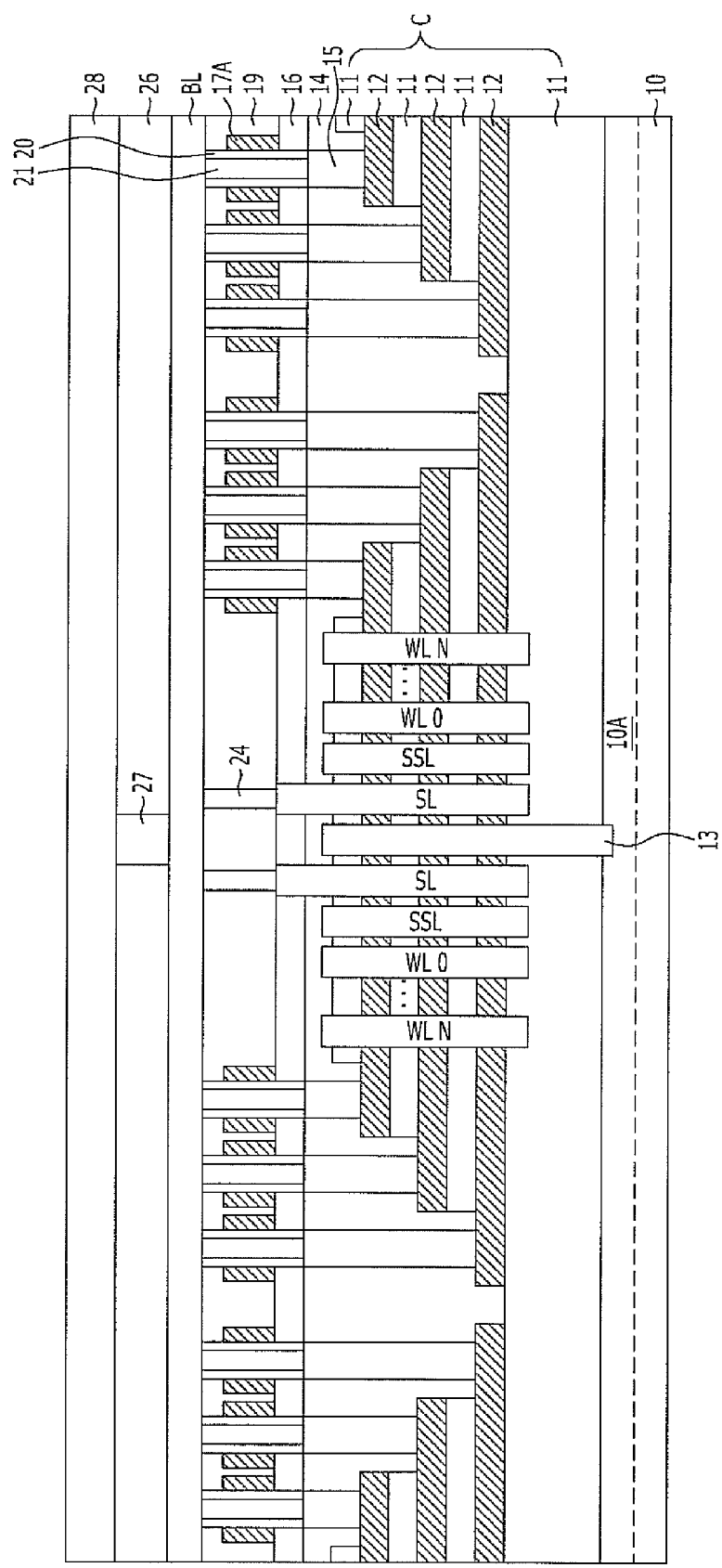
FIGS. 6A and 6B illustrate a non-volatile memory device in accordance with a fourth embodiment of the present invention and a fabrication method thereof.
Figure 6B:
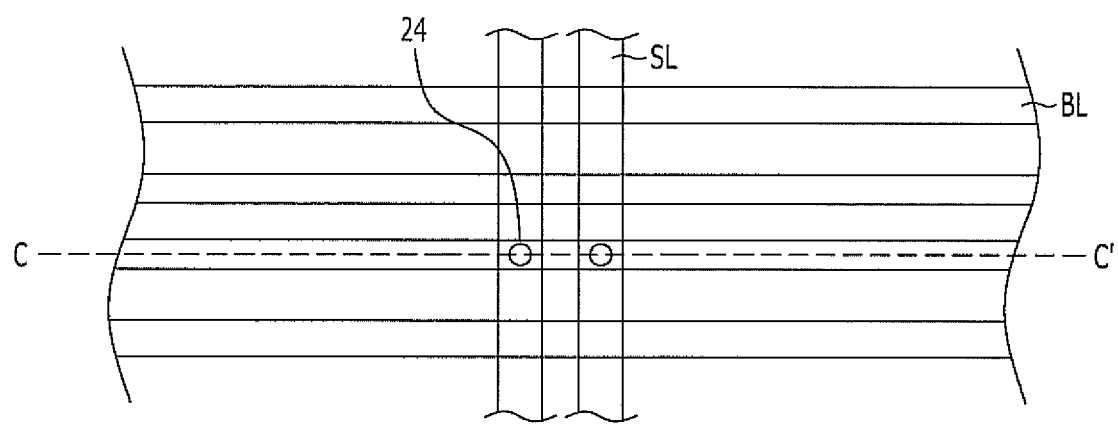

FIGS. 6A and 6B are views illustrating a non-volatile memory device according to a fourth embodiment of the present invention and a fabrication method thereof. Specifically, FIG. 6A illustrates the non-volatile memory device according to the fourth embodiment of the present invention, and FIG. 6B is a top view illustrating some of the elements shown in FIG. 6A. FIG. 6A is a cross-sectional view taken alone line C-C' of FIG. 6B. If necessary, FIG. 6A and FIG. 6B will be referred to simultaneously. This embodiment will be described while focusing the differences from the first embodiment.

Referring to FIGS. 6A and 6B, the same process shown in FIGS. 2A to 2D for the first embodiment is performed, and subsequently a conductive layer pattern 17 for drain selection lines is formed on the resulting structure. Subsequently, the third insulating layer 19, the conductive layer pattern 17 for drain selection lines, and the second insulating layer 16 are selectively etched to form contact holes that expose channel contacts 15, respectively. Subsequently, a gate insulating film 20 is formed on sidewalls of the contact holes, and the contact holes having the gate insulating film 20 formed therein are filled with a channel material to form channels 21 for drain selection transistors. The conductive layer pattern 17 for drain selection lines that was etched in this process forms drain selection lines 17A.

Also, the third insulating layer 19 is selectively etched to form at least two contact holes exposing the two source lines SL, respectively, and a conductive material is filled in the contact holes to form at least two first contacts 24 connected to the two source lines SL, respectively. Here, the first contacts 24 are formed at positions overlapping with at least one of the bit lines BL. This embodiment shows that the first contacts are disposed at the interactions between one bit line BL and two source lines SL, but the scope of the present invention is not limited thereto.

Subsequently, a conductive film is deposited on the third insulating layer 19 and patterned to form bit lines BL, which are connected to the channels 21 for drain selection transistors arranged in the first direction. The bit lines BL may extend in the first direction.

Among these bit lines BL, at least one bit line BL connected with the first contacts 24, for example, the bit line BL in line C-C, is a dummy bit line, which does not function as a bit line BL. Of course, bit lines BL to which the first contacts 24 are not connected function as conventional bit lines BL.

According to this embodiment, two source lines SL can be connected to each other by connecting the first contacts 24 to one or more of the bit lines BL. In this case, a separate process of forming a source line-connecting portion is not required, and thus the device fabrication process is simplified.

Subsequently, a fourth insulating layer 26 covering the bit lines BL is formed. A second contact 27 is formed to pass through the fourth insulating layer 26 to connect to the bit line BL that is connected with the first contacts 24.

Subsequently, a conductive material is deposited on the fourth insulating layer 26 and patterned to form a metal wiring line 28. The metal wiring line may extend in a given direction and is connected to the second contacts 27. The metal wiring line 28 may be made of a low-resistance material such as a metal while having large size. Because the source lines SL are connected to this low-resistance metal wiring line 28 via the first contact 24, the bit line BL, and the second contacts 27, the resistance of the source lines may be reduced.

The non-volatile memory device as shown in FIG. 6A can be fabricated by the above-described steps. However, in the fourth embodiment, the top ends of the source lines SL are connected to each other using at least one of the bit lines BL while they are connected to the metal wiring line 28 via the second contact 27. Thus, similar to the device of FIG. 2F, the erase efficiency of the device can be increased, and the resistance of the source lines SL can be reduced.

Figure 7A:
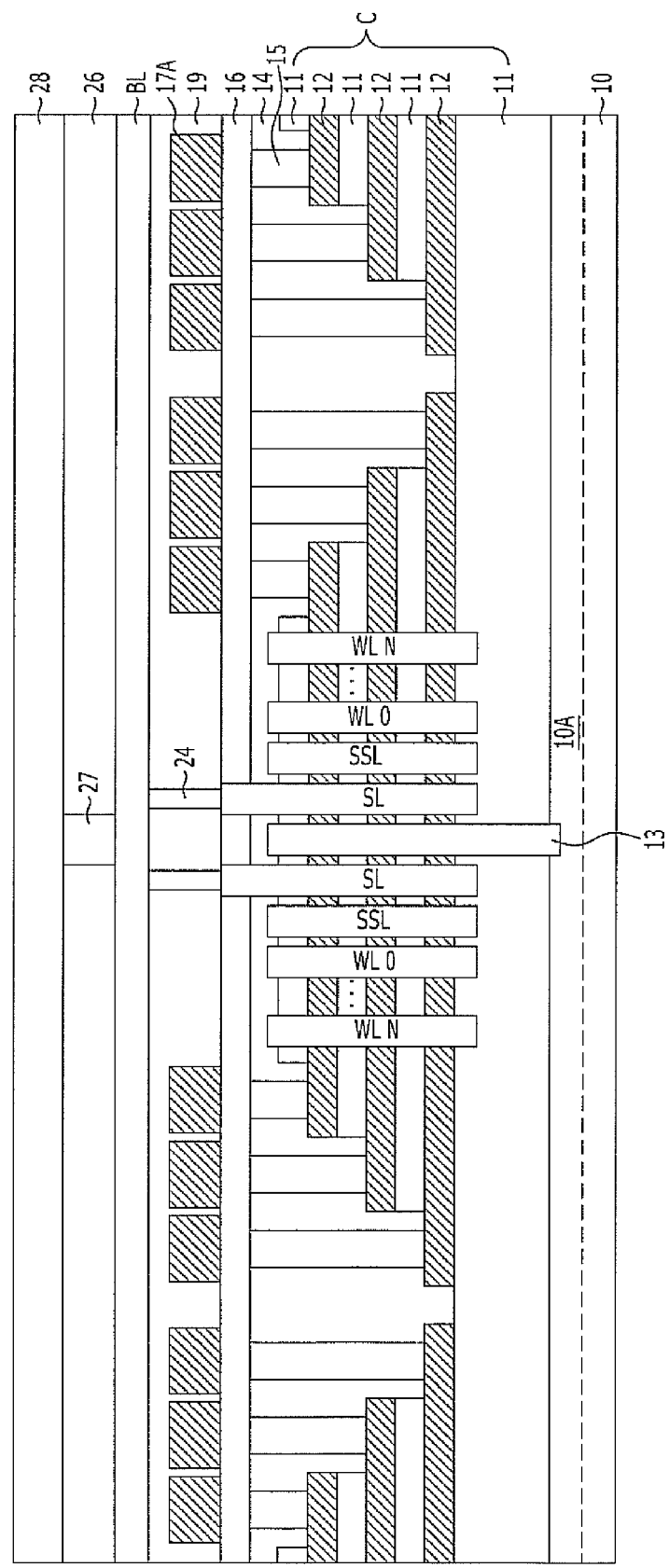
FIGS. 7A to 7C illustrate a non-volatile memory device in accordance with a fifth embodiment of the present invention and a fabrication method thereof.
Figure 7B:
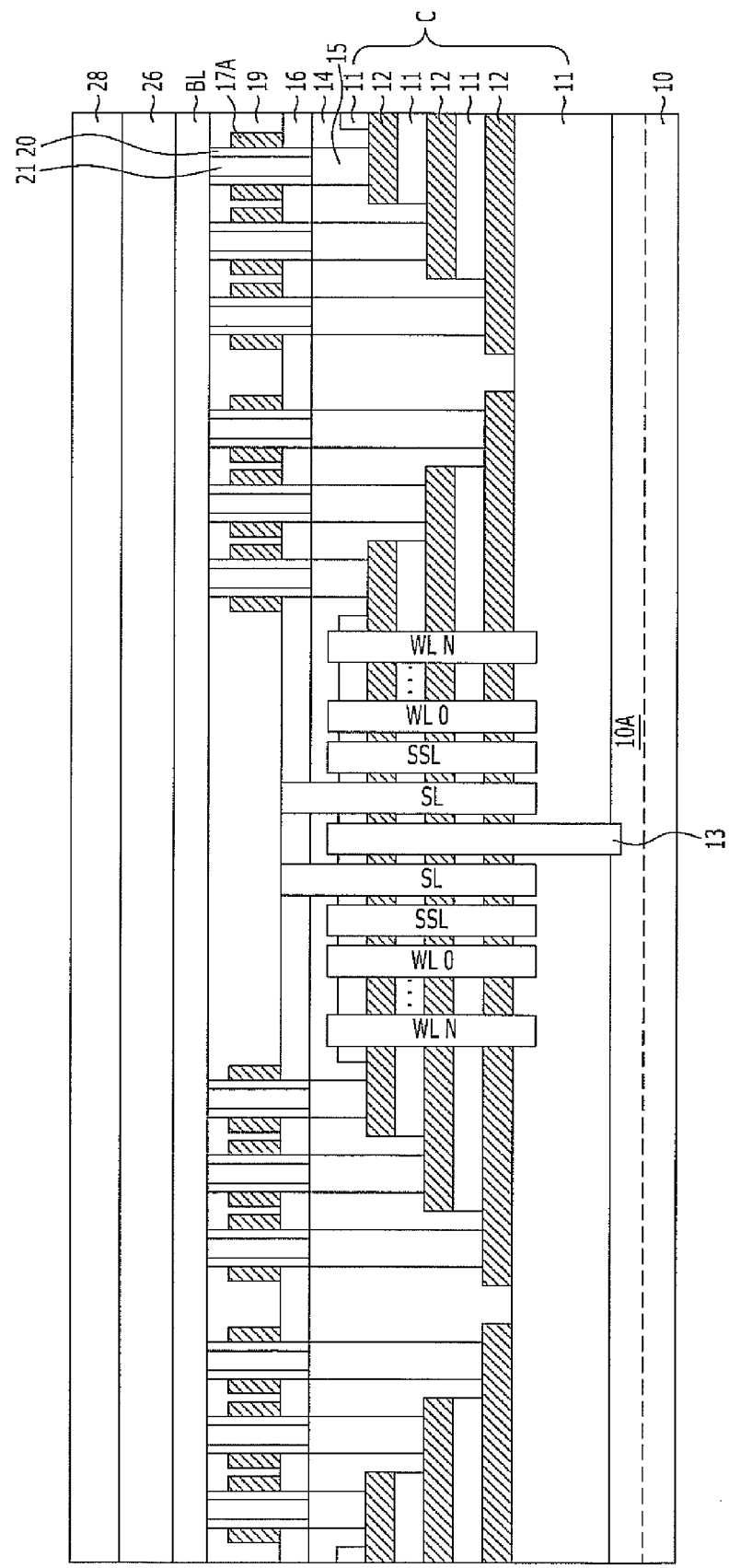
Figure 7C:
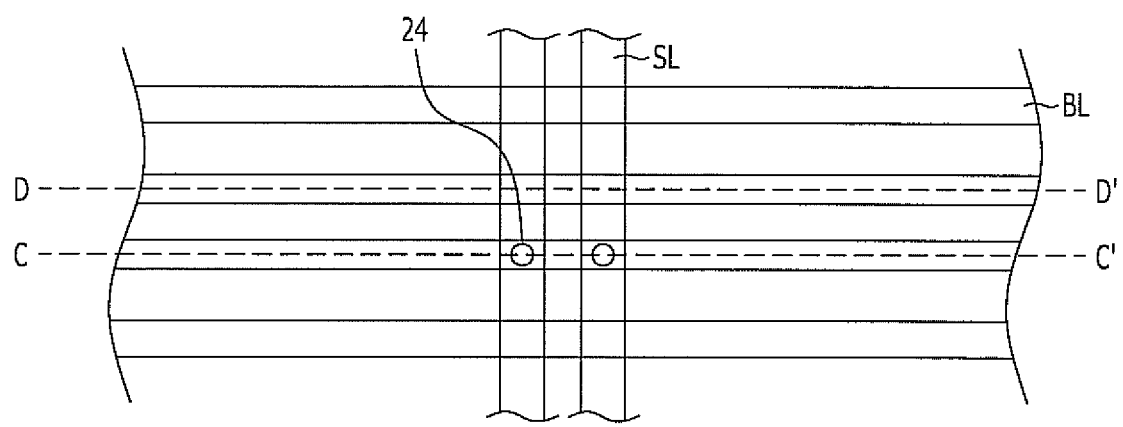

FIGS. 7A to 7C are views illustrating a non-volatile memory device according to a fifth embodiment of the present invention and a fabrication method thereof. Specifically, FIGS. 7A and 7b illustrate the non-volatile memory device according to the fifth embodiment of the present invention, and FIG. 7C is a top view illustrating some of the elements shown in FIGS. 7A and 7B. FIGS. 7A and 7B show cross-sections taken along lines C-C' and D-D' of FIG. 7C, respectively. If necessary, FIGS. 7A, 7B and 7C will be referred to simultaneously. This embodiment will be described while focusing on the differences from the first embodiment.

First, the same process shown in FIGS. 2A to 2D for the first embodiment is performed, a conductive layer pattern 17 is formed on the resulting structure from the processes shown in FIGS. 2A to 2D, and a third insulating layer 19 covering the conductive layer pattern 17 is formed. As a result, the same structure shown in FIG. 5A is obtained.

Subsequently, the third insulating layer is selectively etched to form two or more contact holes exposing two source lines SL, respectively. A conductive material is filled in the contact holes to form two or more first contacts 24 connected to the two source lines SL, respectively (see FIGS. 7A and 7C). Here, the first contacts 24 are formed at positions overlapping with one or more of bit lines BL.

Also, the third insulating layer 19, the conductive layer pattern 17 for drain selection lines, and the second insulating layer 16, are selectively etched to form contact holes exposing the channel contacts 15, respectively. The third insulating layer 19, the conductive layer pattern 17 for drain selection lines, and the second insulating layer 16 are etched in the regions other than the region where a bit line that is connected with the first contacts 24 is to be formed. A gate insulating film 20 and a channel 21 are formed in the contact holes (see FIG. 7B). However, in the region where a bit line BL that is to be connected with the first contacts 24 is formed, the process of forming the contact holes and the process of forming the gate insulating layer 20 and the channel 21 are not performed (see FIG. 7A).

Subsequently, a conductive film is deposited on the third insulating layer 19 and patterned to form bit lines BL that extend in the first direction. Here, bit lines BL that are not connected with the first contacts 24, for example, the bit line BL in line D-D' of FIG. 7C, are connected with the channels 21 for drain selection transistors arranged in the first direction and function as conventional bit lines BL. However, one or more bit lines BL connected with the first contacts 24, for example, the bit line BL in line C-C', is a dummy bit line that does not function as a bit line BL, and it is not connected with structures other than the first contacts 24. As described above, in the region where the bit line BL to be connected with the first contacts 24 is to be formed, the channels 21 for drain selection transistors and the like are not formed.

According to this embodiment, two source lines SL can be connected to each other by connecting the first contacts 24 to one or more of bit lines BL. In this case, a separate process for forming a source line-connecting portion is not required, and thus the device fabrication process is simplified. In addition, because the bit line BL to which the first contacts 24 are connected is not connected with the channels 21 for drain selection transistors, the capacitance of the bit line can be reduced.

Subsequently, a fourth insulating layer 26 covering the bit lines BL is formed. After forming the fourth insulating layer 26, a second contact 27 is formed to pass through the fourth insulating layer 26 to be connected to the bit line BL connected with the first contacts 24.

Subsequently, a conductive material is deposited on the fourth insulating layer 26 and patterned to form a metal wiring line 28. The metal wiring line 28 is connected with the second contact 27 and extends in a given direction. The metal wiring line 27 may be a low-resistance material such as a metal having a large size. Because the source lines SL are connected to this low-resistance metal wiring line 28 via the first contacts 24, the bit line BL, and the second contact 27, the resistance the source lines SL can be reduced.

The non-volatile memory device as shown in FIGS. 7A and 7B can be fabricated by the above-described steps. However, in the fifth embodiment, the upper ends of the source lines SL are connected to each other using one or more of the bit lines BL while they are connected to the metal wiring line 28 through the second contact 27. Thus, similar to the device of FIG. 2F, the erase efficiency of the device can be increased, and the resistance of the source lines SL can be reduced.

Figure 8:
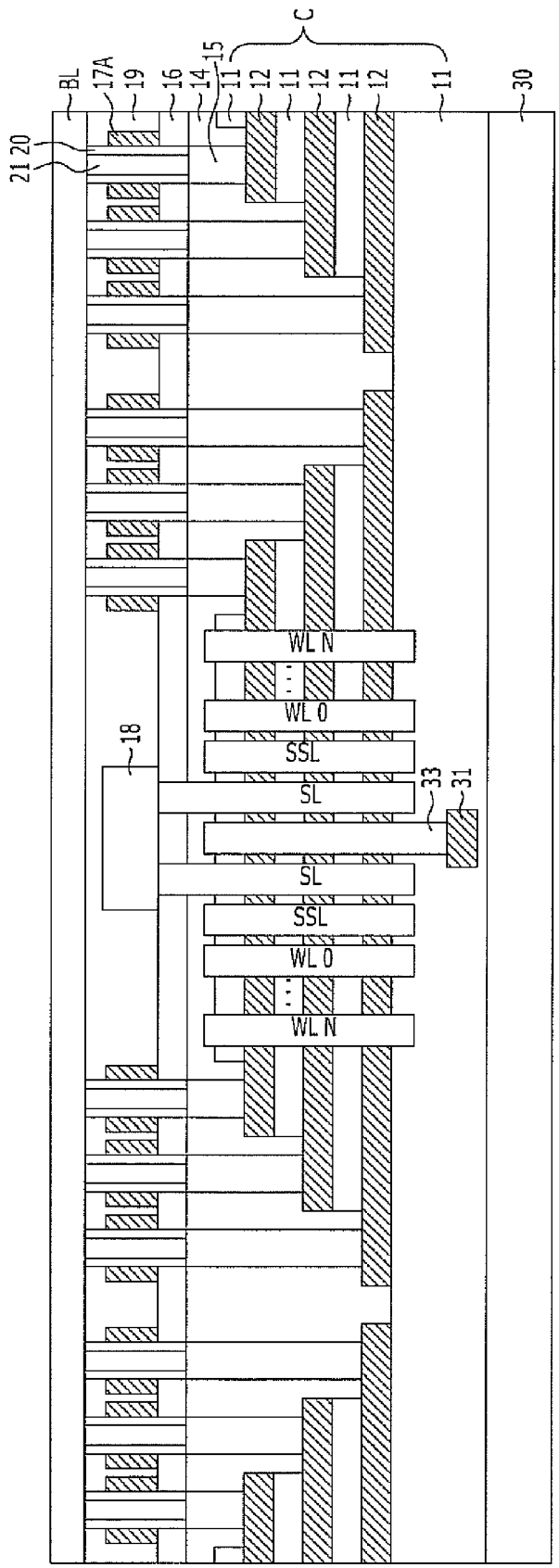
FIG. 8 illustrates a non-volatile memory device in accordance with a sixth embodiment of the present invention and a fabrication method thereof.

FIG. 8 illustrates a non-volatile memory device according to a sixth embodiment of the present invention and a fabrication method thereof. This embodiment will be described while focusing the differences from the first embodiment.

Referring to FIG. 8, a substrate 30 is provided. The substrate 30 may be a silicon substrate such as a semiconductor substrate.

Subsequently, a gate insulating film (not shown) is formed on the substrate 30, and a conductive film such as a P-type semiconductor or a metal is deposited thereon and patterned to form a gate 31 for a peripheral circuit transistor. Here, the gate 31 may be formed beneath a P-type semiconductor pattern 33.

A subsequent process is substantially the process described in the first embodiment, except that, in the first embodiment, the P-type semiconductor pattern 13 is formed such that the lower end of the P-type semiconductor pattern 13 contacts the P-type impurity-doped region 10A of the substrate 10, but in the sixth embodiment, the P-type semiconductor pattern 33 is formed such that the lower end of the P-type semiconductor pattern 33 contacts the gate 31 on the substrate 30.

In this case, holes of the P-type semiconductor pattern 33 can be supplied directly to the channel layers 12 by applying high positive voltage to the gate 31, and thus the erase efficiency of the device can be increased.

Although not shown, the device of the sixth embodiment can be modified similar to the first to fifth embodiments in order to reduce the resistance of the source lines SL. In other words, in the second to fifth embodiments, the P-type semiconductor pattern 13 connected to the P-type impurity-doped region 10A can be replaced with the P-type semiconductor pattern 33 connected to the peripheral circuit transistor gate 31.

As described above, according to the non-volatile memory cell device of the present invention and the fabrication method thereof, the integration degree of the memory cells can be increased by vertically stacking the memory cells, while the device can efficiently perform an erase operation. In addition, the resistance of the source lines can be reduced.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device comprising:
   a substrate including a P-type impurity-doped region;
   a channel structure comprising a plurality of interlayer insulating layers that are alternately stacked with a plurality of channel layers on the substrate;
   a P-type semiconductor pattern that contacts sidewalls of all of the plurality of channel layers, wherein a lower end of the P-type semiconductor pattern contacts the P-type impurity-doped region; and
   source lines that are disposed at both sides of the P-type semiconductor pattern and contact the sidewalls of all of the plurality of channel layers.

2. The non-volatile memory device of claim 1, wherein the impurity concentration of the P-type semiconductor pattern is lower than the impurity concentration of the P-type impurity-doped region.

3. The non-volatile memory device of claim 1, wherein upper ends of the source lines disposed at both sides of the P-type semiconductor pattern are connected to each other.

4. The non-volatile memory device of claim 3, wherein the upper ends of the source lines disposed at both sides of the P-type semiconductor pattern are connected together to a bit line disposed over the channel structure.

5. The non-volatile memory device of claim 4, wherein the bit line is connected to a metal wiring line that is disposed above the bit line via a contact.

6. The non-volatile memory device of claim 4, wherein the bit line is not connected with a channel of a drain selection transistor that is disposed below the bit line.

7. The non-volatile memory device of claim 3, wherein the upper ends of the source lines disposed at both sides of the P-type semiconductor pattern are connected to a pad that is disposed in the same layer as a bit line that is formed above the channel structure, and the pad is spaced apart from the bit line.

8. The non-volatile memory device of claim 1, further comprising:
   a gate formed over the substrate and disposed below the channel structure,
   wherein lower ends of the source lines are connected to the gate.

9. A non-volatile memory device comprising:
   a substrate;
   a first gate formed over the substrate;
   a channel structure disposed over the first gate and comprising a plurality of interlayer insulating layers that are alternately stacked with a plurality of channel layers;
   a P-type semiconductor pattern that directly contacts sidewalls of all of the plurality of channel layers, wherein a lower end of the P-type semiconductor pattern contacts the first gate; and
   source lines that are disposed at both sides of the P-type semiconductor pattern and contact the sidewalls of all of the plurality of channel layers.

10. The non-volatile memory device of claim 9, wherein upper ends of the source lines disposed at both sides of the P-type semiconductor pattern are connected to each other.

11. The non-volatile memory device of claim 10, wherein the upper ends of the source lines disposed at both sides of the P-type semiconductor pattern are connected together to a bit line disposed above the channel structure.

12. The non-volatile memory device of claim 11, wherein the bit line connected with the source line is not connected with a channel of a drain selection transistor that is disposed below the bit line.

13. The non-volatile memory device of claim 9, further comprising:
   a second gate formed over the substrate,
   wherein lower ends of the source lines are connected to the second gate.

* * * * *